United States Patent
Cheng

(10) Patent No.: US 9,722,618 B1
(45) Date of Patent: Aug. 1, 2017

(54) SYSTEMS AND METHODS OF PHASE-LOCKED LOOP INVOLVING CLOSED-LOOP, CONTINUOUS FREQUENCY RANGE, AUTO CALIBRATION AND/OR OTHER FEATURES

(71) Applicant: GSI TECHNOLOGY, INC., Sunnyvale, CA (US)

(72) Inventor: Yu-Chi Cheng, San Ramon, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/745,341

(22) Filed: Jun. 19, 2015

Related U.S. Application Data

(63) Continuation of application No. 14/214,542, filed on Mar. 14, 2014, now Pat. No. 9,083,356.

(60) Provisional application No. 61/783,374, filed on Mar. 14, 2013.

(51) Int. Cl.
- *H03L 7/00* (2006.01)
- *H03L 7/10* (2006.01)
- *H03L 7/091* (2006.01)
- *H03K 21/38* (2006.01)

(52) U.S. Cl.
CPC ............ *H03L 7/105* (2013.01); *H03K 21/38* (2013.01); *H03L 7/091* (2013.01)

(58) Field of Classification Search
CPC .................................................... H03L 7/0891
See application file for complete search history.

(56) References Cited

U.S. PATENT DOCUMENTS

| | | |
|---|---|---|
| 4,677,394 A | 6/1987 | Vollmer |
| 5,696,468 A | 12/1997 | Nise |
| 5,748,044 A | 5/1998 | Xue |
| 5,942,949 A | 8/1999 | Wilson et al. |
| 6,114,920 A | 9/2000 | Moon et al. |
| 6,133,770 A | 10/2000 | Hasegawa |
| 6,175,282 B1 | 1/2001 | Yasuda |
| 6,661,267 B2 | 12/2003 | Walker et al. |
| 6,683,502 B1 | 1/2004 | Groen et al. |
| 6,816,019 B2 | 11/2004 | Delbo' et al. |
| 6,838,951 B1 | 1/2005 | Nieri et al. |
| 6,933,789 B2 | 8/2005 | Molnar et al. |
| 6,998,922 B2 | 2/2006 | Jensen et al. |
| 7,002,416 B2 | 2/2006 | Pettersen et al. |
| 7,019,569 B2 | 3/2006 | Fan-Jiang |
| 7,046,093 B1 | 5/2006 | McDonagh et al. |
| 7,047,146 B2 | 5/2006 | Chuang et al. |
| 7,099,643 B2 | 8/2006 | Lin |
| 7,141,961 B2 | 11/2006 | Hirayama et al. |

(Continued)

*Primary Examiner* — Daniel Puentes

(74) *Attorney, Agent, or Firm* — DLA Piper LLP (US)

(57) ABSTRACT

Systems and methods involving phase-locked-loop (PLL) circuitry are disclosed. In one illustrative implementation, a PLL circuit device may comprise voltage controlled oscillator (VCO) circuitry having a bias signal that sets a frequency range, circuitry that shifts the VCO circuitry to operate in one of the frequency ranges, and other circuitry to compare/calibrate signals and/or set the bias current. According to further implementations, as a function of operation of the circuitry, an operating frequency range of the VCO circuitry may be shifted to a different operating frequency range, and closed-loop, continuous frequency range, auto-calibration or other features may be provided.

7 Claims, 13 Drawing Sheets

(56) References Cited

U.S. PATENT DOCUMENTS

| | | |
|---|---|---|
| 7,233,214 B2 | 6/2007 | Kim et al. |
| 7,263,152 B2 | 8/2007 | Miller et al. |
| 7,269,402 B2 | 9/2007 | Uozumi et al. |
| 7,330,080 B1 | 2/2008 | Stoiber et al. |
| 7,352,249 B2 | 4/2008 | Balboni et al. |
| 7,355,482 B2 | 4/2008 | Meltzer |
| 7,463,101 B2 | 12/2008 | Tung |
| 7,538,623 B2 | 5/2009 | Jensen et al. |
| 7,659,783 B2 | 2/2010 | Tai |
| 7,663,415 B2 | 2/2010 | Chatterjee et al. |
| 7,719,330 B2 | 5/2010 | Lin et al. |
| 7,746,181 B1 | 6/2010 | Moyal |
| 7,746,182 B2 | 6/2010 | Ramaswamy et al. |
| 7,760,032 B2 | 7/2010 | Ardehali |
| 7,760,040 B2 | 7/2010 | Zhang et al. |
| 7,876,163 B2 | 1/2011 | Hachigo |
| 7,956,695 B1 | 6/2011 | Ding et al. |
| 8,008,956 B1 | 8/2011 | Shin et al. |
| 8,044,724 B2 | 10/2011 | Rao et al. |
| 8,174,332 B1 | 5/2012 | Lombaard et al. |
| 2004/0090413 A1 | 5/2004 | Yoo |
| 2004/0160250 A1 | 8/2004 | Kim et al. |
| 2005/0226357 A1 | 10/2005 | Yoshimura |
| 2005/0253658 A1* | 11/2005 | Maeda .................... H03L 7/099 331/2 |
| 2006/0119443 A1 | 6/2006 | Azam et al. |
| 2008/0129402 A1* | 6/2008 | Han .......................... H03L 7/18 331/179 |
| 2009/0296869 A1 | 12/2009 | Chao et al. |
| 2010/0271138 A1 | 10/2010 | Thakur et al. |

\* cited by examiner

SYSTEMS AND METHODS OF PHASE-LOCKED LOOP INVOLVING CLOSED-LOOP, CONTINUOUS FREQUENCY RANGE, AUTO CALIBRATION AND/OR OTHER FEATURES

CROSS-REFERENCE TO RELATED APPLICATION INFORMATION

This is a continuation of application Ser. No. 14/214,542, filed Mar. 14, 2014, now U.S. Pat. No. 9,083,356, which claims the benefit/priority of provisional application No. 61/783,374, filed Mar. 14, 2013, all of which are hereby incorporated by reference in entirety.

BACKGROUND

Field

Aspects herein are directed to phase lock loop systems and methods involving circuitry with optimal operation ranges, improved performance at process corners, and/or reduced sensitivity to jitter.

Description of Related Information

Phase locked loop (PLL) circuits are widely used as clock generators for a variety of applications including microprocessors, wireless devices, serial link transceivers, and disk drive electronics, among others. FIG. 1 illustrates a block diagram of a typical charge-pump based PLL circuit design, including a Phase Frequency Detector (PFD) 108, Charge Pump (CP) 112, Loop Filter (LPF) 116, Voltage Control Oscillator (VCO) 120, and multiple Dividers 104, 128, 124.

Various existing phase lock loop circuits may be configured with a VCO that generates an output clock that is frequency-locked and phase aligned with the input clock by virtue of a negative feedback loop. According to such circuitry, the output clock frequency will be defined by the following equation when PLL is in lock condition:

$$CKOUT=CKIN*(N/M)*(1/P)$$

Further, in such embodiments, a typical VCO operates in a certain frequency range that will determine the PLL operating frequency range. The frequency of the VCO is controlled by Vcnt, the input voltage to the VCO. FIG. 2A shows a typical input voltage Vcnt versus VCO frequency, V-F curve. This VCO V-F curve will vary for different process corners. For example, for a slow process corner 224, the VCO frequency may be lower for the same Vcnt voltage. And for a fast process corner 228, the VCO frequency may be higher for the same Vcnt voltage. In other words, to maintain the same output frequency, a slow corner will require a higher Vcnt, and a fast corner will require a lower Vcnt. Moreover, there is a limited operating voltage range for Vcnt which is defined by the Vcnt(min) and the Vcnt (max). Therefore, it is very important to keep Vcnt within its operating voltage range for any process corner.

The frequency limit, freq_max 212, is highest frequency that VCO can generate, and the minimum frequency, freq_min 216, is the lowest frequency VCO can generate. As such, the VCO gain of FIG. 2A, Kvco, may be given by the following equation:

$$Kvco=\Delta F/\Delta V=(freq\_max-freq\_min)/(Vcnt\_max-Vcnt\_min)$$

If VCO gain (Kvco) is very large, then any small amount of change in input voltage Vcnt will translate into a big frequency disturbance at the VCO output, which will eventually show as jitter at the final output clock, CKOUT. Therefore, it is undesirable to design a VCO with a Kvco value that is too large such as 232 in FIG. 2A. If a circuit's frequency range is not expansive enough to cover the required range of operating frequencies, then a designer will have to increase the VCO gain to have steeper V-F curve such that it can cover the much higher and/or lower operating frequencies.

Turning to illustrative operation of the implementations shown in FIG. 2A, FIG. 2B is a timing diagram illustrating input voltage Vcnt required for high frequency operation curve 236 and a low frequency operation curve 240. Here, an input voltage Vcnt234 of a very high value (0.94 v) may be required, e.g. at 244, for the VCO to generate a high frequency clock output a at slow process corner. Conversely, an input voltage Vcnt of a very low value (0.12 v) may be required, e.g. at 248, for low frequency clock output at fast process corner. Such restrictions may severely push the headroom for the charge pump circuitry, and cause large current mismatch between charging current Ip and discharging current In. To avoid drawbacks such as the above-mentioned charge-pump current mismatch, it is desirable to keep the Vcnt operating near the middle range of power supply voltage (VDD) at any process corners.

Overview of Some Aspects

For example, various systems and methods consistent with aspects of the present inventions may involve PLL circuitry wherein associated voltage controlled oscillator components operate at an optimal range such that the control voltage, Vcnt, will always settle near the middle of supply voltage (VDD) for any process corners. Further, as a function of utilization of a plurality of operating frequency range settings, the slope of the plural associated V-F curves (represented by VCO gain Kvco) are also kept small enough to reduce the sensitivity of PLL jitter due to any fluctuation at Vcnt.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the innovations herein and, together with the description, help illustrate the principles of the present inventions. In the drawings.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Figure 1:
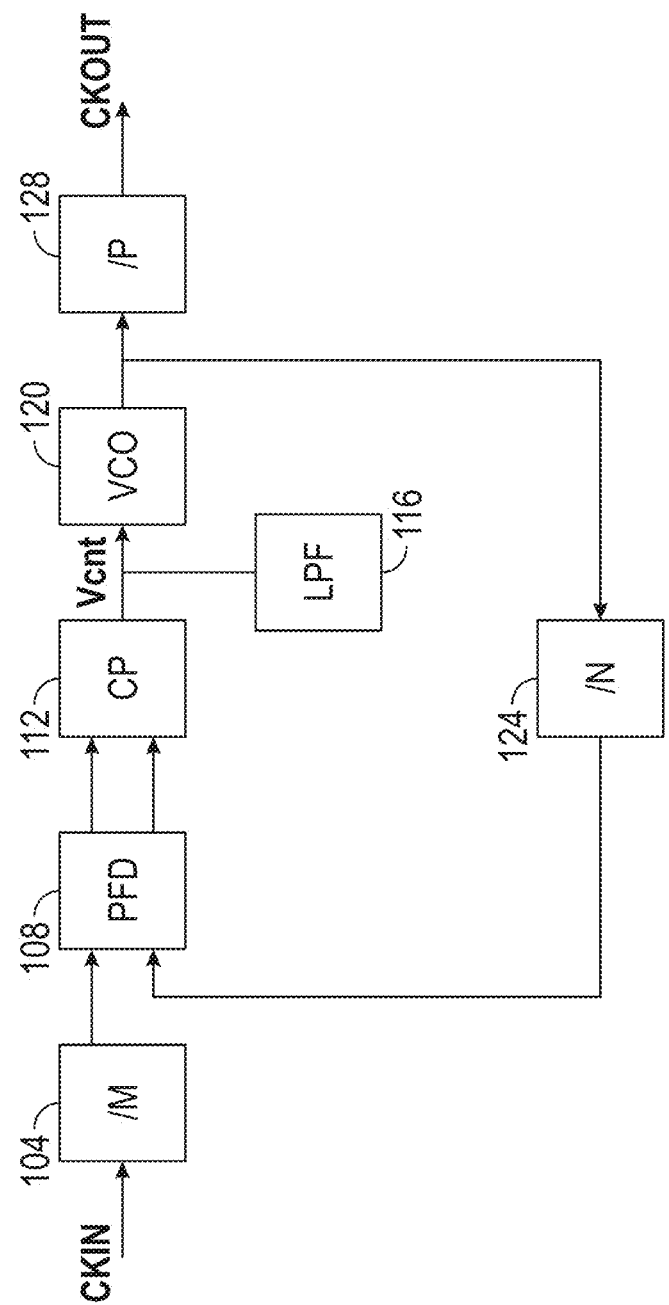
FIG. 1 is a block diagram of a known phase lock loop.
Figure 2A:
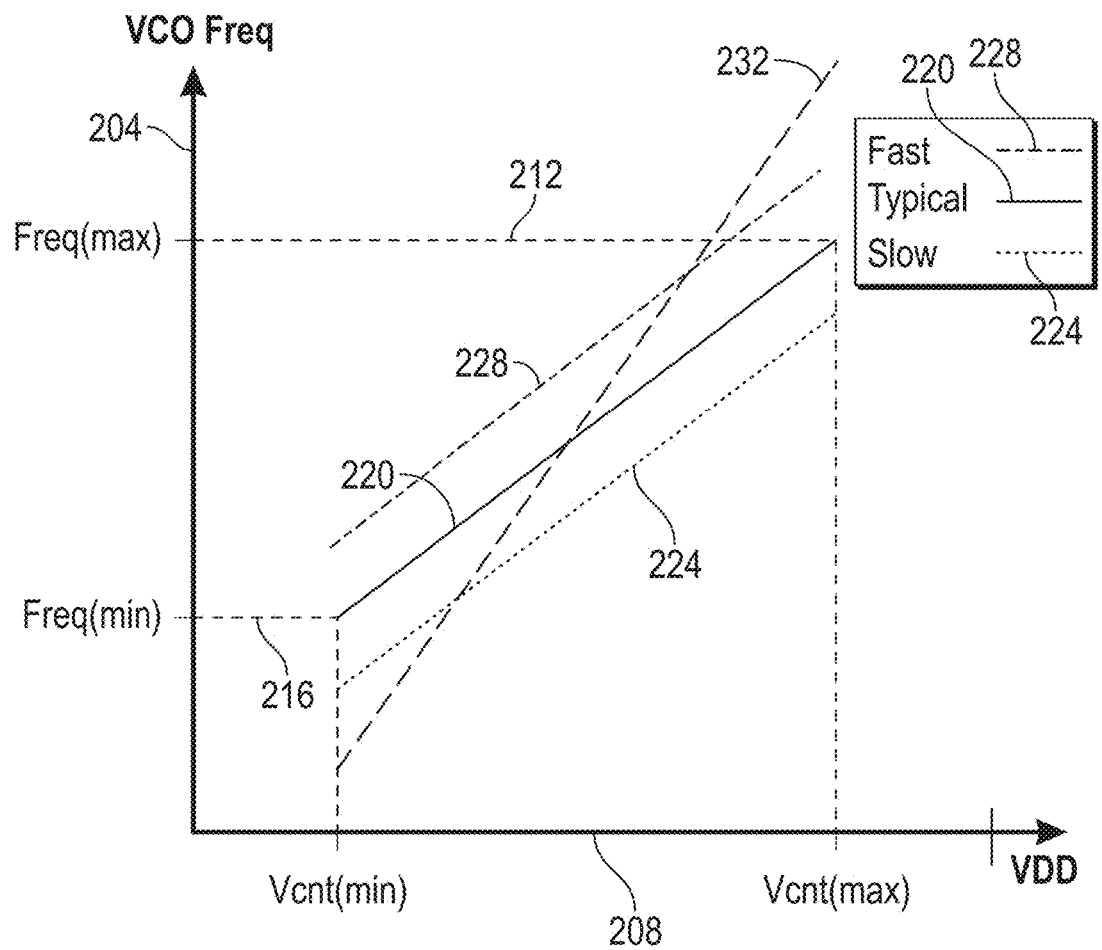
FIG. 2A is a graph showing exemplary relationships of voltage against frequency in according to known voltage controlled oscillator (VCO) circuitry.
Figure 2B:
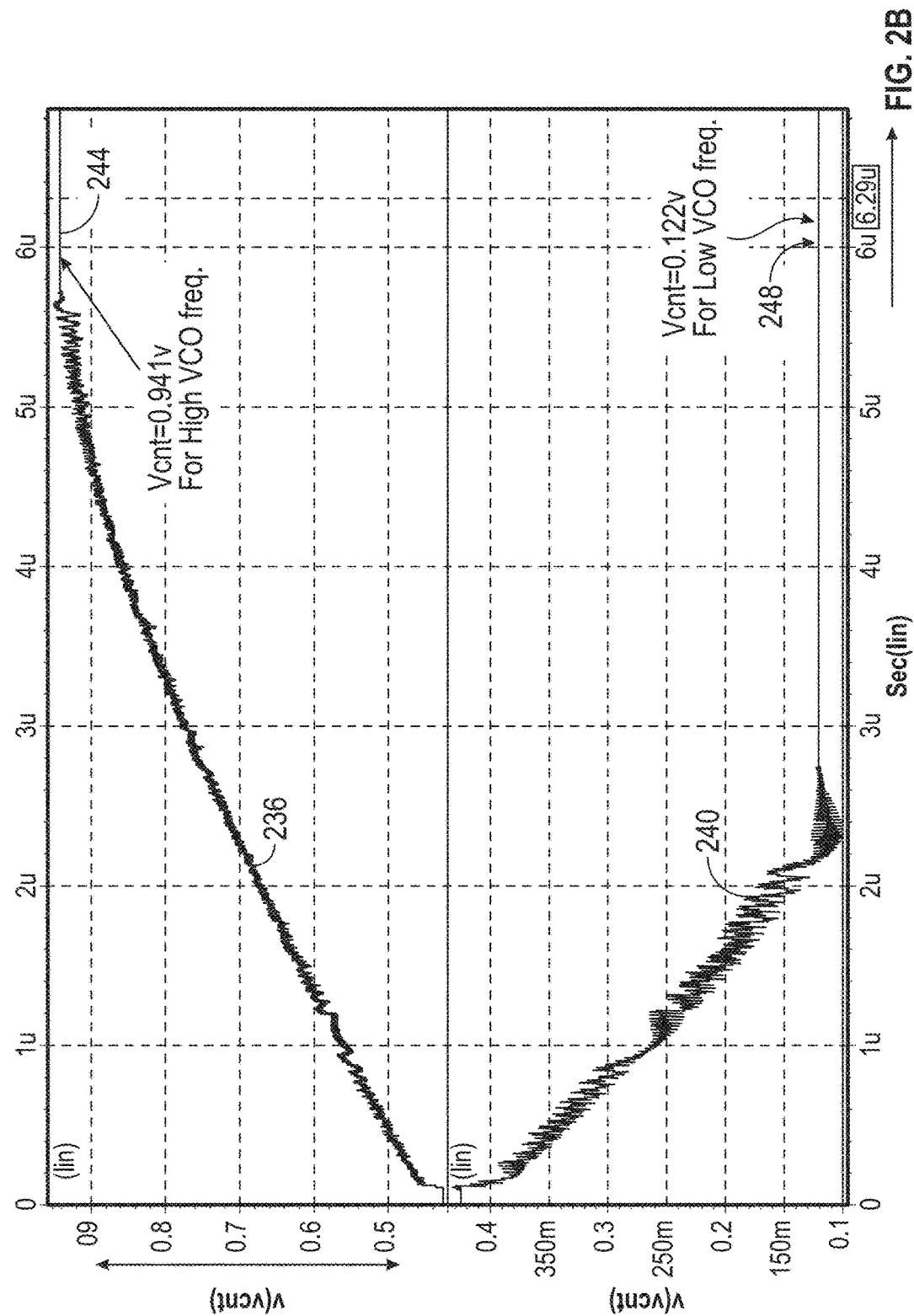
FIG. 2B is a graph showing an exemplary relationship of VCO input voltage against frequency in illustrative VCO circuitry.
Figure 3:
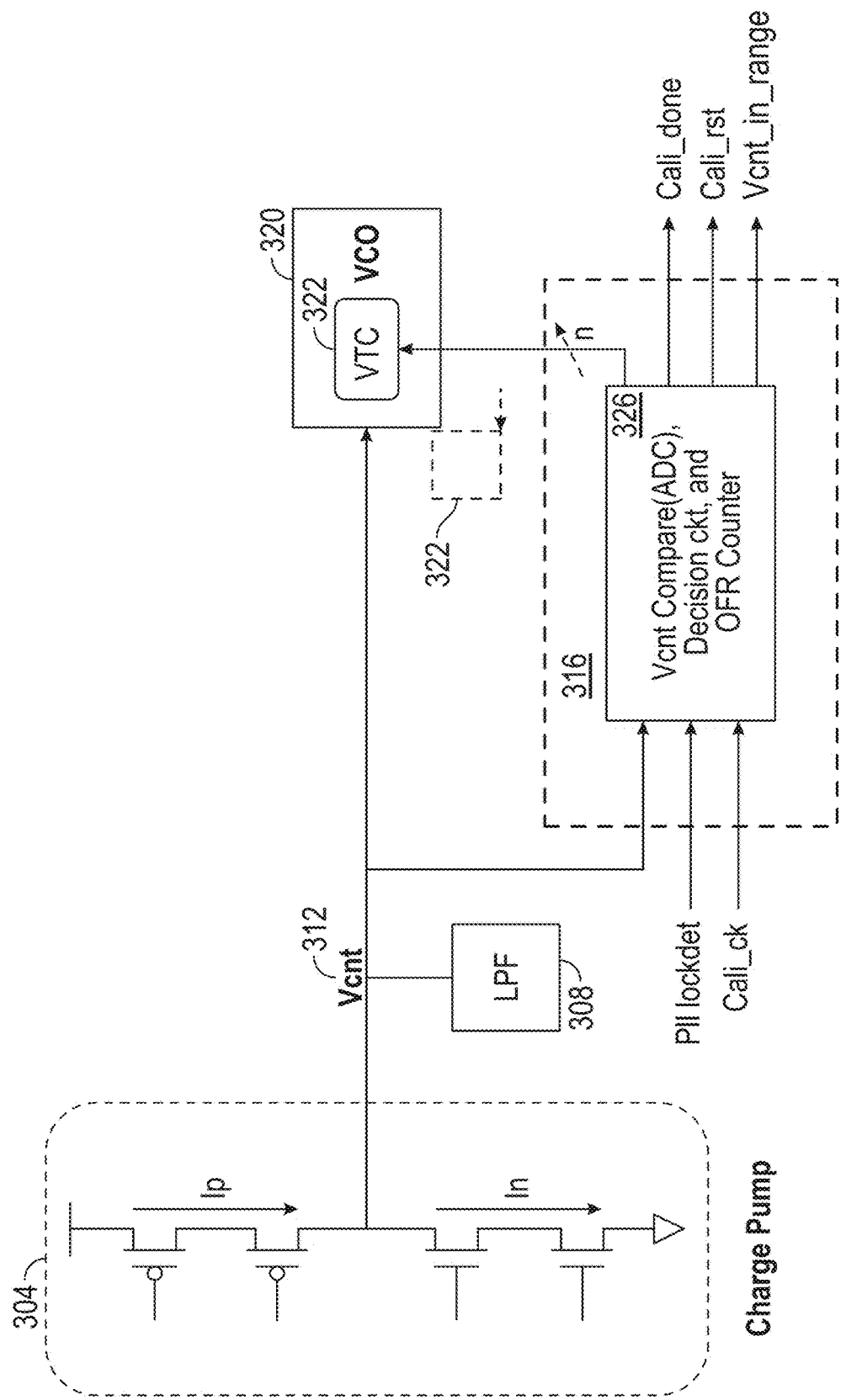
FIG. 3 is a block diagram showing high-level, illustrative PLL circuitry consistent with certain aspects related to the innovations herein.

Various representative systems and methods involving the present phase lock loop innovations are shown in FIGS. 3-11. Consistent with implementations herein, PLL circuitry including voltage controlled oscillator (VCO) circuitry may be configured to operate in several different frequency ranges. FIG. 3 is a block diagram illustrating such PLL circuitry having closed-loop continuous auto calibration consistent with certain aspects related to the innovations herein. Referring to FIG. 3, an illustrative phase lock loop circuit is shown, comprising a center voltage Vcnt line 312, a filter 308 such as a low pass filter, VCO-related circuitry 320, and calibration circuitry 316. In illustrative implementations, such calibration circuitry may comprise various subcircuitry 326, for example, input voltage (Vcnt) compare circuitry including analog-to-digital converter (ADC) circuitry, decision circuitry and control circuitry such as Operating Frequency Range (OFR) counter circuitry.

Here, for example, at a first operating frequency range for the OFR counter circuitry, calibration circuitry 316 may be configured to monitor and detect the input voltage and determine whether or not Vcnt is within the desired range. If Vcnt is out of its desired range, either too high or too low, then the OFR counter will shift up or down, respectively. Further, the PLL circuitry may be configured with Voltage-to-Current converter (VTC) circuitry 322 inside of or associated with the VCO circuitry 320 that will change the bias current based on the OFR counter, and thus shift the VCO to operate at the appropriate frequency, such as the next adjacent frequency range, at which time a calibration complete signal 332 may be provided. The phase lock loop circuitry may then be configured to reset (e.g., Vcnt may be reset to a specific voltage, such as ½ VDD) and start another closed-loop calibration procedure. Here, for example, such rest process may be initiated via a calibration reset signal 334. In some implementations, this calibration procedure may be an automatic process and may continue until the Vcnt is within the desired range. When within range, a control voltage (Vcnt) in-range signal 336 may be provided as output. Moreover, such auto calibration may be done in a closed-loop, continuous fashion. Various exemplary OFR auto-calibration waveforms of certain phase lock loop innovations are shown and described in more detail in connection with FIG. 6A and FIG. 6B, below.

Figure 4:
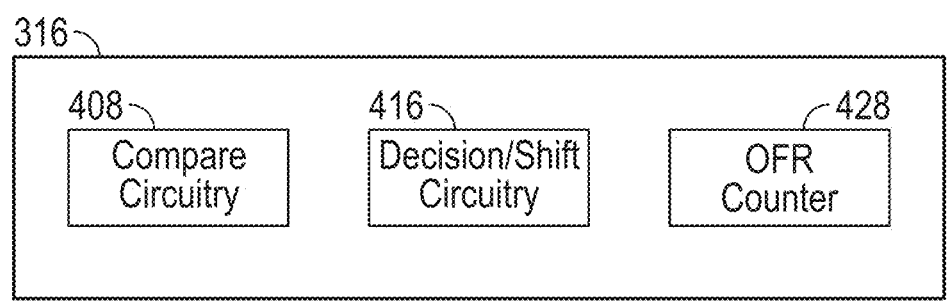
FIG. 4 is a block diagram showing illustrative calibration circuitry 316 of the PLL circuitry of FIG. 3, consistent with certain aspects related to the innovations herein.
Figure 5:
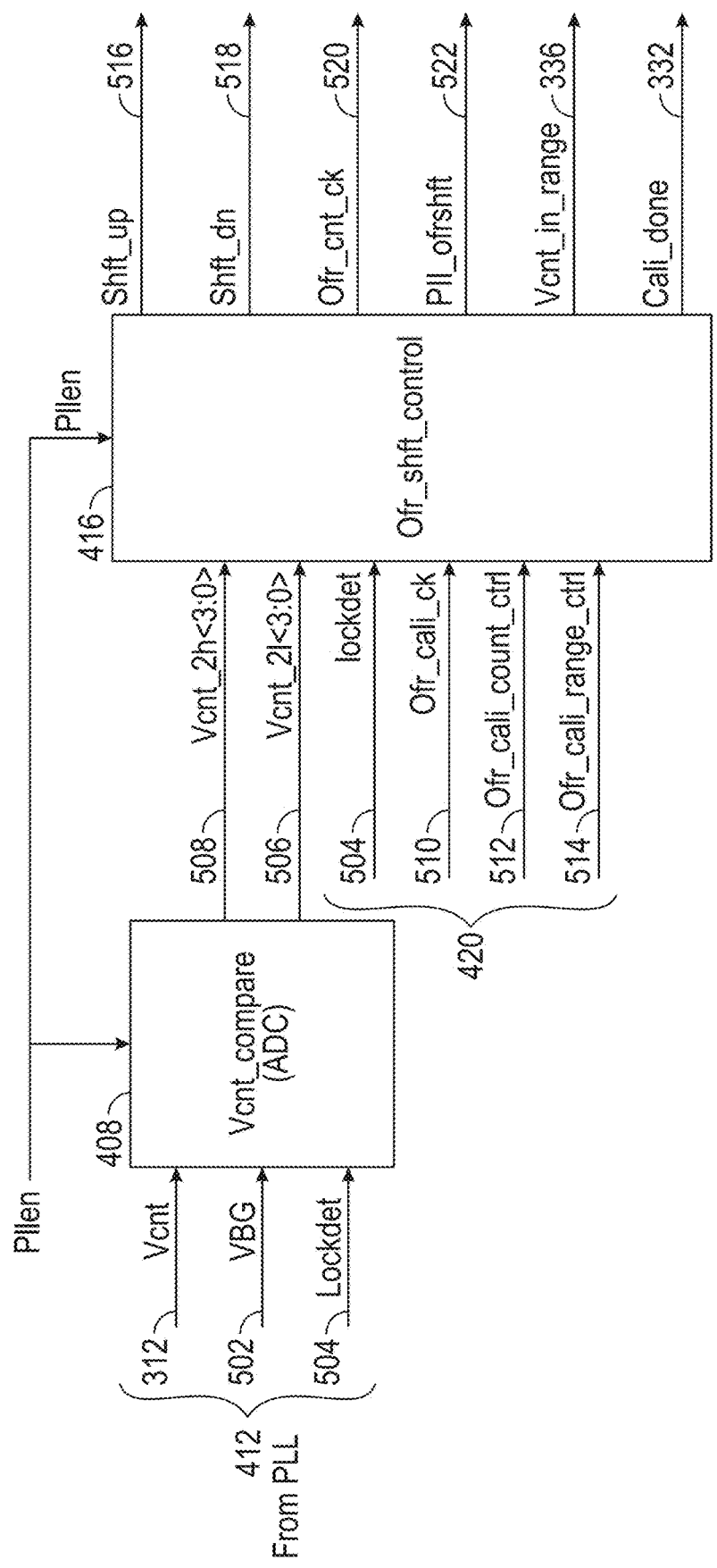
FIGS. 5-6 are block diagrams illustrating exemplary PLL circuitry associated with FIG. 4 and closed-loop continuous auto calibration features consistent with certain aspects related to the innovations herein.
Figure 6:
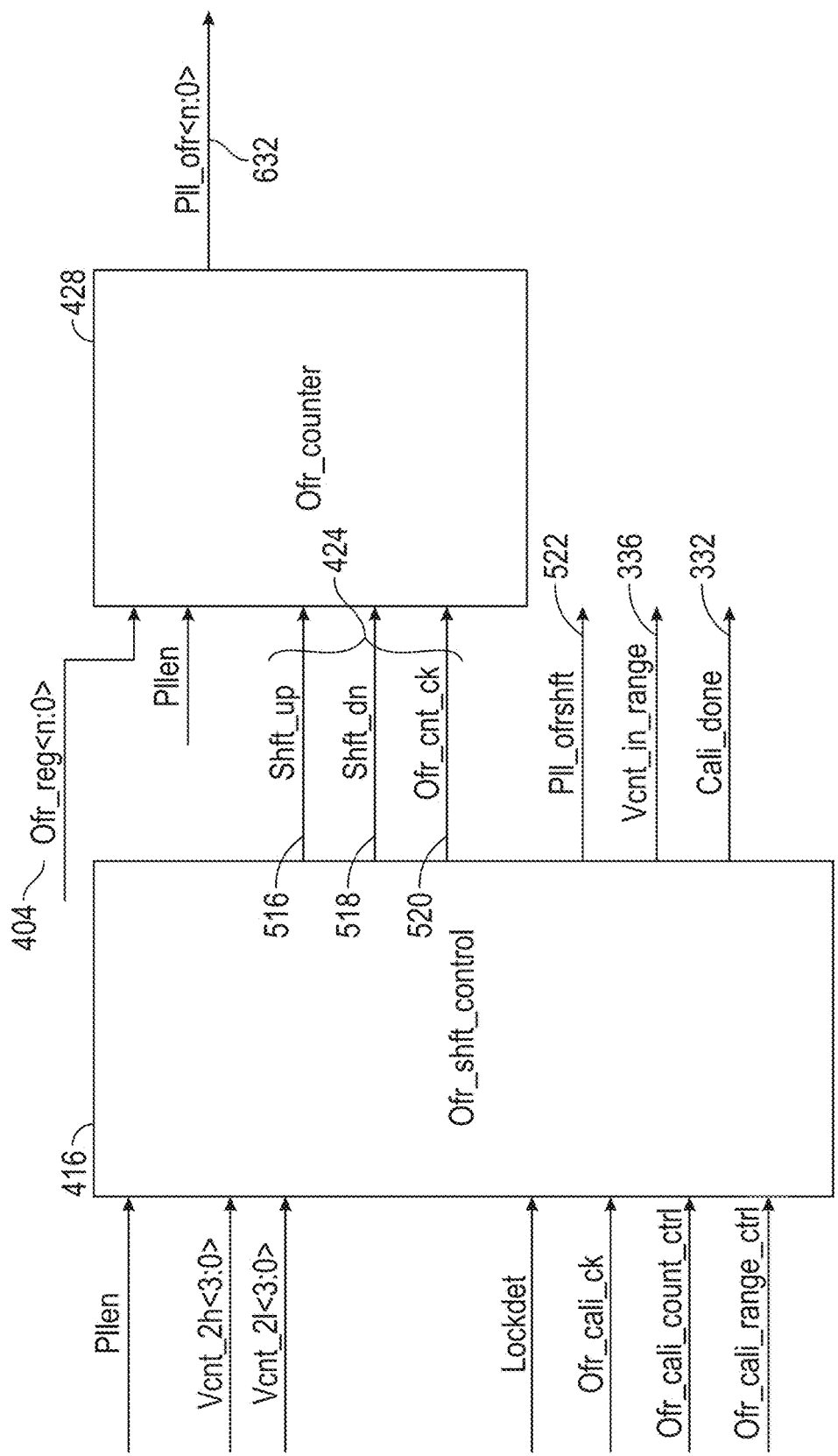

FIGS. 4-6 are block diagrams illustrating exemplary calibration circuitry 316 having closed-loop continuous auto calibration consistent with certain aspects related to the innovations herein. One representative implementation of calibration circuitry 316 is shown in FIG. 4, including compare circuitry 408, decision/shift circuitry 416 and control circuitry 428 such as OFR counter circuitry. More detailed, illustrative implementations of such circuitry is shown in FIGS. 5 and 6.

Referring to FIG. 5, a first portion of exemplary calibration circuitry 316 and associated connections are shown, including the compare circuitry 408 and the decision/shift circuitry 416. Compare circuitry 408 may be configured to monitor and detect the input voltage and determine whether or not Vcnt is within the desired range. If Vcnt is out of its desired range, either too high or too low, appropriate processing is performed in the decision/shift circuitry 416 to instruct the control/counter circuitry to shift up or to shift down, respectively. In addition to the Vcnt level, compare circuitry may have inputs receiving input signals from, inter alia, the PLL core 412, such as Bandgap voltage Vbg 502, lock detect 504, and Vcnt 312. If Vcnt is detected to be out of range, such as when the operating frequency range is too low, the compare circuitry may send a low signal 506 to the decision/shift circuitry 416. Upon receipt of such signal, the decision/shift circuitry 416 may effect a switch up to a higher operating frequency range, such as via reset of Vcnt to Vdda/2, to avoid the VCO from running too fast. The decision/shift circuitry 416 may include various additional inputs, such as a Vcnt high input, lock detect, an operating frequency range calibration check 510, an operating frequency range count control 512, and an operating frequency range calibration range control 514, among others. The decision/shift circuitry may include various outputs, such as shift up 516, shift down 518 and an operating frequency range control clock 520 provided to the control/counter circuitry 428, as well as a PLL operating frequency shift 522 and the Vcnt in range 336 and calibration complete 332 outputs noted above. Further, the calibration circuitry 316 may also be configured to perform such operating frequency range adjustments after the PLL has started a locking procedure. Here, for example, the decision/shift circuitry 416 still uses the compare circuitry 408 results to determine a shift up or a shift down, though the calibration circuitry 316 is further configured, via OFR counter circuitry 428, to generate an OFR shift signal (pll_ofrshft) 429 back to the PLL core to restart locking.

Turning to FIG. 6, connections and interaction between as well as to and from the decision/shift circuitry 416 and the control/counter circuitry 428 are shown. Here, for example, outputs from the decision/shift circuitry 416 such as shift up

516, shift down 518, and operating frequency range control clock 520, may be provided to the control/counter circuitry 428. In turn, the OFR counter circuitry 428 may provide control signals to external circuitry, including operating frequency range control signals 432 to the PLL core and to the VCO circuitry and/or VTC circuitry, among others. The operating frequency range control signals are utilized to operate the VCO to function at one of a plurality of gain levels, with the slope of such V-F curves being configured to provide the desired frequency for the available/established input voltage Vcnt range, with minimum jitter.

Further aspects and details involving calibration circuitry 316 configuration and operation are set forth in connection with FIGS. 8-9, 10A-10B and 11, below.

Figure 7:
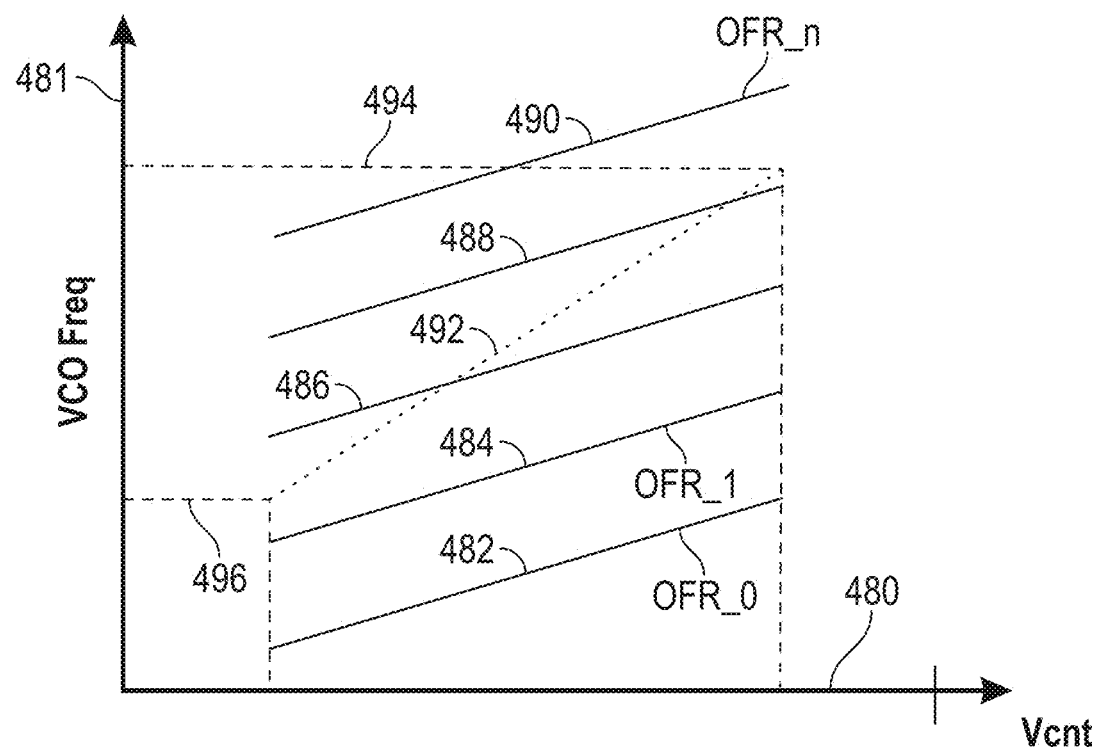
FIG. 7 is a graph showing exemplary relationships of voltage against frequency in illustrative voltage controlled oscillator (VCO) circuitry, consistent with certain aspects related to the innovations herein.

FIG. 7 is a graph showing exemplary relationships of voltage 480 against frequency 481 (V-F) curves in illustrative voltage controlled oscillator (VCO) circuitry, consistent with certain aspects related to the innovations herein. Referring to FIG. 7, five V-F curves 482, 484, 486, 488, 490 are shown for the purpose of illustration, however implementations herein may be configured with greater or fewer quantities of such operating frequency ranges. Specifically, as depicted in the illustrative graph of FIG. 7, a lowest OFR range (OFR_0) 482 is shown, configured to provide the lowest range of VCO frequency for the corresponding voltage, Vcnt. Similarly, FIG. 4D also illustrates a highest OFR range (OFR_n) 490 configured to provide the highest range of VCO frequency for the corresponding Vcnt operating voltage range, as well as a variety of intermediate OFR ranges 484, 486, 488. By means of shifting the VCO to the most suitable frequency range, among these, the PLL may iteratively perform its closed loop calibration processes until Vcnt is within the desired range. In some implementations, for example, circuitry may be configured such that the final Vcnt is settled near ½ VDD for any process corner.

Figure 8:
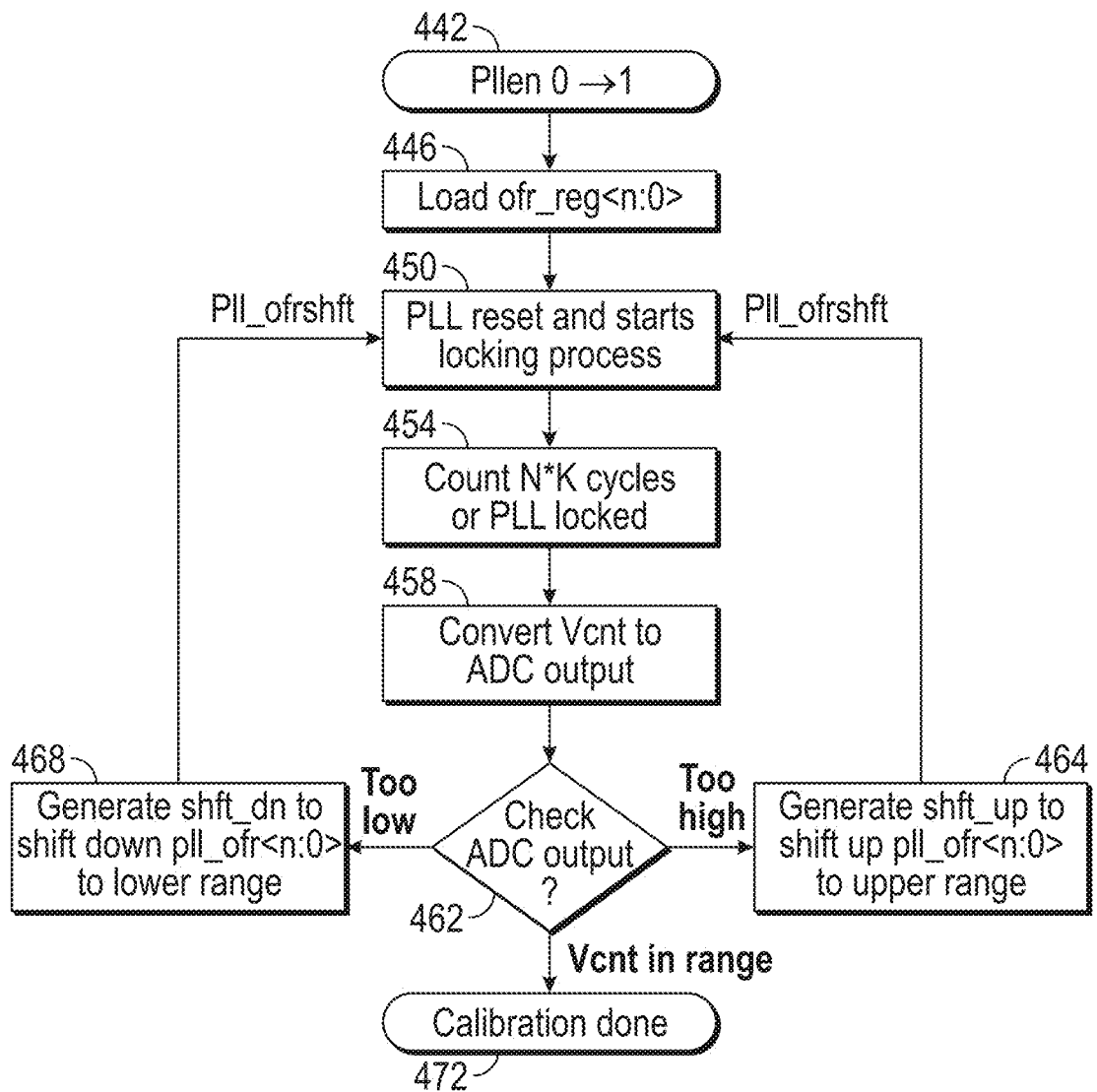
FIG. 8 is a flow diagram illustrating an exemplary auto-calibrating PLL algorithm consistent with certain aspects related to the innovations herein.

FIG. 8 is a flow diagram illustrating an exemplary auto-calibration algorithm consistent with certain circuitry and aspects related to the innovations herein. The process shown in FIG. 8 begins with a PLL enable command 442 initiating the PLL locking procedure to seek a phase lock condition. At 446, an operating frequency range value (e.g., register ofr_reg<n:0>) may then be loaded as the initial operating frequency range inside the PLL. A PLL reset signal may then be executed, at 450, to start the locking process. Next, at 454, the algorithm may wait a certain time or settling period of the locking process, i.e., a wait period such as a specified count of the calibration clock or once certain circuit condition(s) are satisfied such as when PLL lock is achieved or Vcnt is too high or too low for a long period of time. After this wait period, at 458, the algorithm and circuitry may then convert Vcnt through an Analog-to-Digital Converter (ADC) with reference voltages such as vh_refs and vl_refsgenerated, e.g., from Bandgap voltage VBG (or power supply VDD) and resistors divider circuitry. Then, at 462, a Vcnt level check is performed to determine if the ADC output (Vcnt) is within an acceptable range or if it is too high or too low. If ADC output (Vcnt) is within an acceptable range, the calibration process is completed, at 472. If, however, ADC output is determined to be too low, the circuitry will generate a shift down signal (shift_dn), at 468, to shift the PLL operating frequency range to a lower level. From there, a new PLL reset is initiated and the algorithm returns to the start of a new locking process, at 450. If, at the Vcnt level check 462, ADC output is determined to be too high, the circuitry will generate a shift up signal (shift_up), at 464, to shift the PLL operating frequency range to a higher level, at 464. From there, a new PLL reset is initiated and the algorithm returns to the start of a new locking process.

Figure 9:
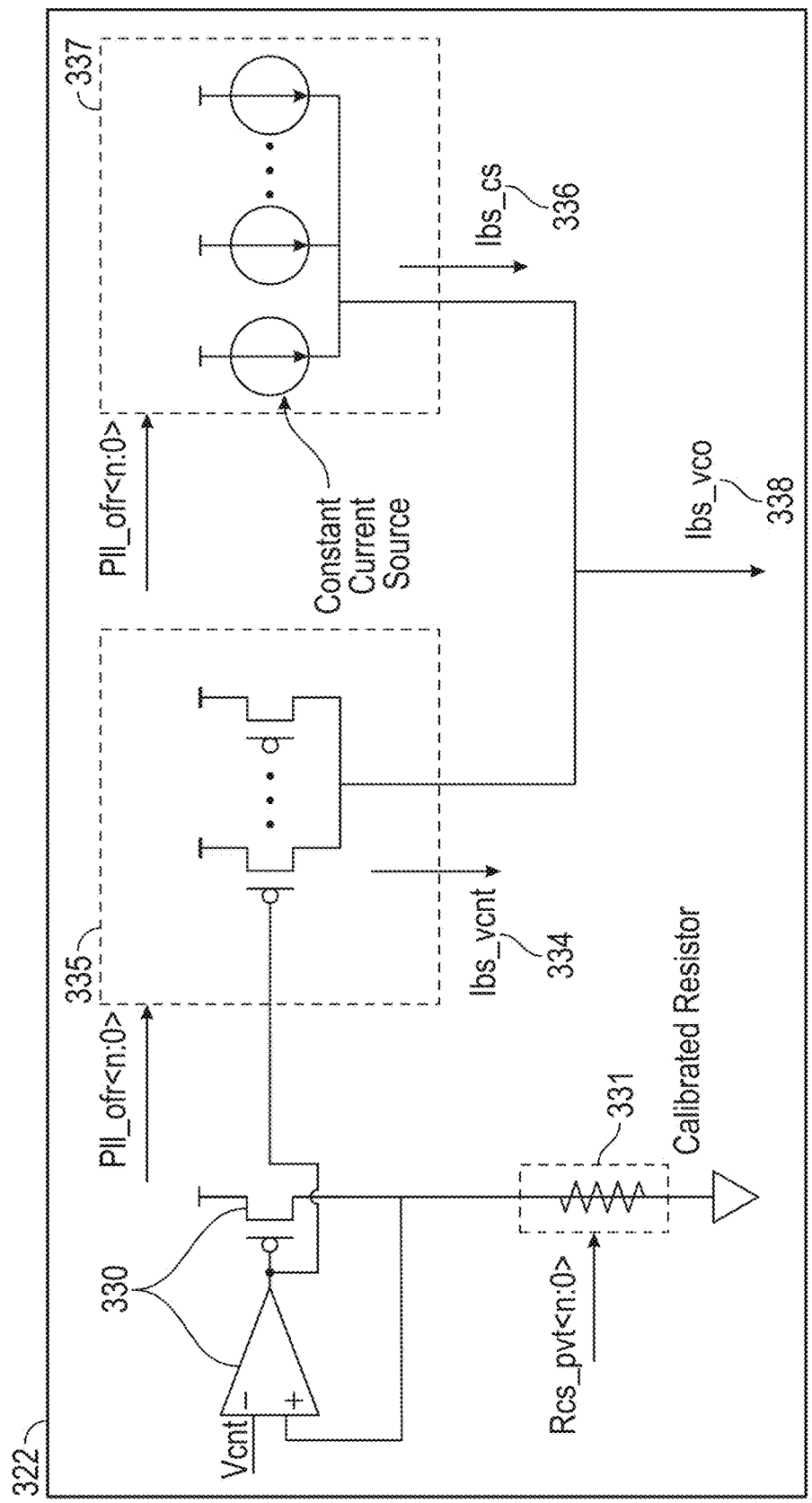
FIG. 9 is a block diagram illustrating further detailed PLL circuitry having closed-loop continuous auto calibration consistent with certain aspects related to the innovations herein.

FIG. 9 is a block diagram depicting illustrative circuit layout details of exemplary VTC circuitry 322, consistent with certain aspects related to the innovations herein. Referring to the representative circuitry shown in these figures, the Vcnt voltage may be converted to current via feedback circuitry 330 such as a feedback network and a calibrated resistor 331, as shown in more detail, for example, in FIGS. 5B2, 5C and 5D of the priority/provisional application incorporated by reference herein and attached hereto as an Appendix. The resistor may be calibrated and may be held constant over different Process, Voltage, and Temperature (PVT). In following circuitry 334, the current ibs_vcnt is combined with another constant current source ibs_cs, from 336, to generate the bias current signal for the VCO 338 (ibs_vco). Further, according to some implementations, a group of vcnt-generated current sources 335 and a group of constant current sources 337 may be one or both of adjustable and/or programmable through ofr<n:0> during the PLL OFR calibration process.

Figure 10A:
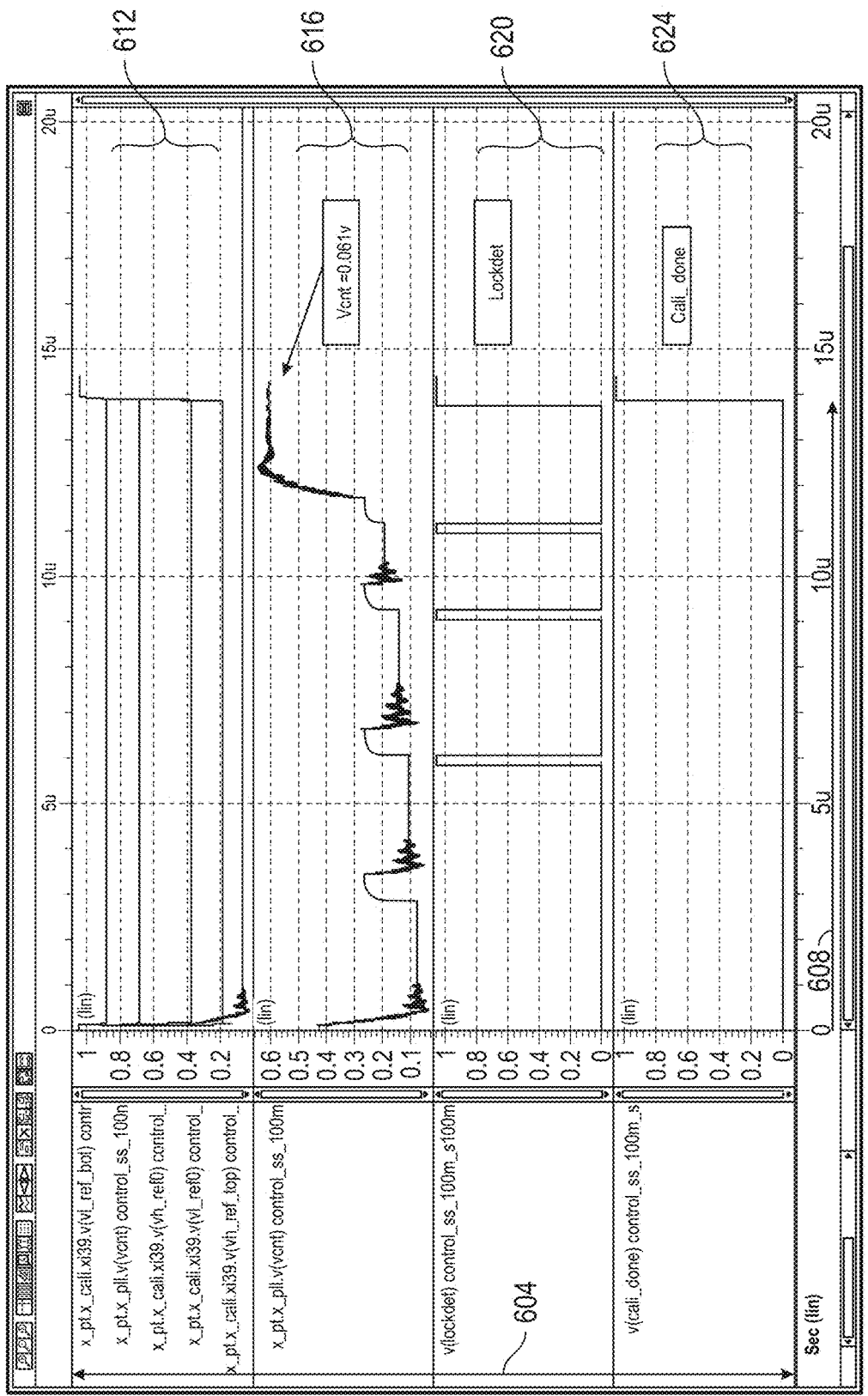
FIG. 10A is a graph illustrating exemplary operating frequency range auto-calibration waveforms of the present PLLs, shifting down, consistent with certain aspects related to the innovations herein.
Figure 10B:
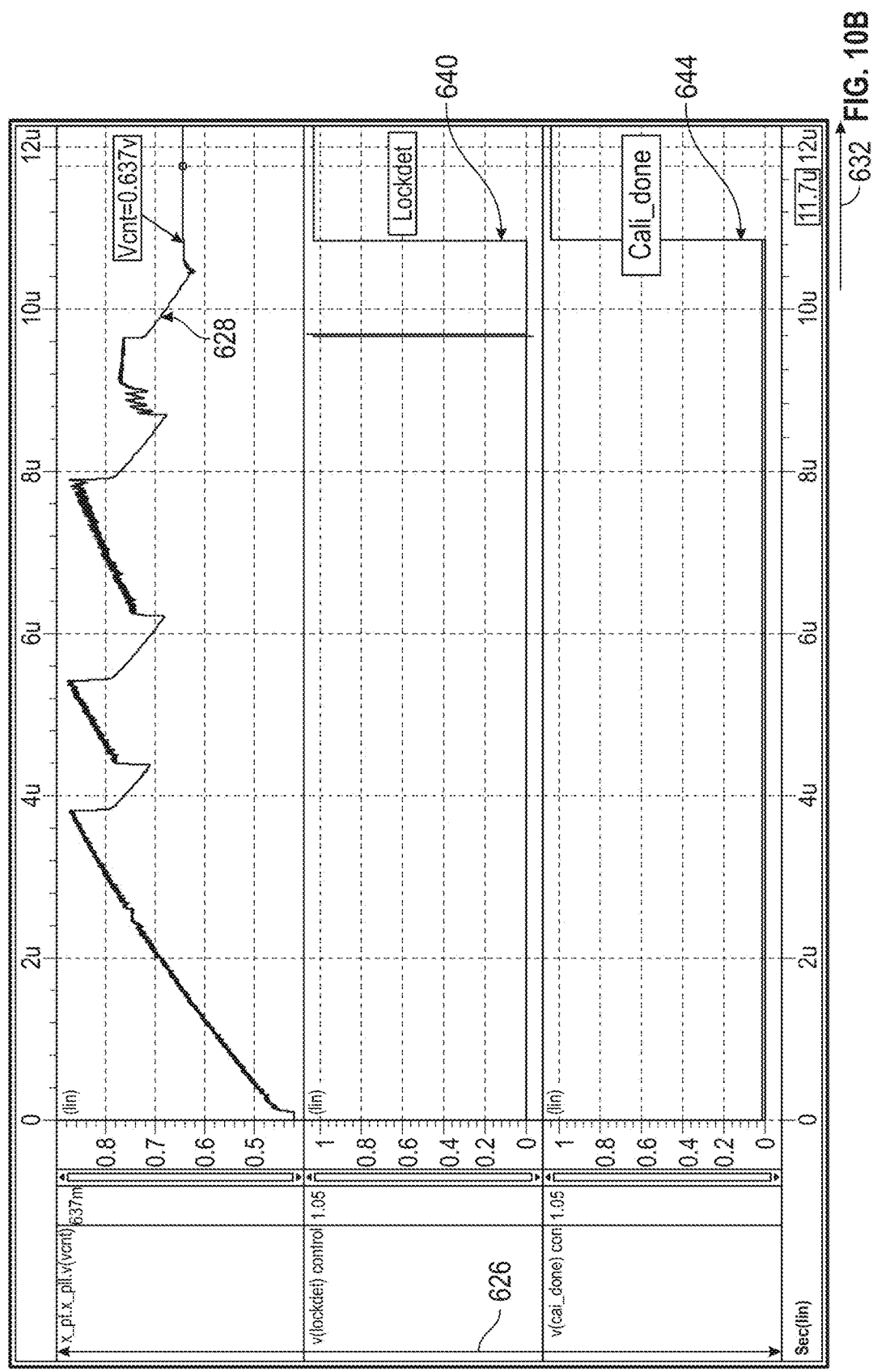
FIG. 10B is a graph illustrating exemplary operating frequency range auto-calibration waveforms of the present PLLs, shifting up, consistent with certain aspects related to the innovations herein.

FIG. 10A is a graph illustrating exemplary operating frequency range auto-calibration waveforms (voltage 604 against time 608) of PLL circuitry, during shift down operation of OFR calibration, consistent with certain aspects related to the innovations herein. As illustrated in FIG. 10A, the graph of Vcnt over time 616 is shown in association with PLL/calibration signals 612, the PLL lock detect signal 620 and the resulting calibration done signal 624. Consistent with the innovations herein, a Vcnt signal beginning at less than 0.1 v settles near the middle of the supply voltage, at 0.61 v. FIG. 10B is a graph illustrating exemplary operating frequency range auto-calibration waveforms (voltage 626 against time 632) of the present PLLs, during shift up operation of OFR calibration, consistent with certain aspects related to the innovations herein. As illustrated in FIG. 10B, the graph of Vcnt over time 628 is shown in association with the PLL lock detect signal 640 and the resulting calibration done signal 644. Consistent with the innovations herein, a Vcnt signal rising to a level as high as 0.85 v settles near the middle of the supply voltage, at 0.637 v. Again, in the presently-described implementation, as illustrated here, a VDD of 1.2 v and associated levels are set forth, however various other values and permutations are of course feasible under the innovations herein.

As set forth above and shown graphically in FIG. 10A and FIG. 10B, the present invented PLL will continuously search for the optimal Operating Frequency Range (OFR) for the VCO and make sure that the final Vcnt is settled near ½ VDD for any process corner (again, above VDD=1.2 v for the illustrated embodiments). Present implementations may also dramatically reduce the mismatch between the charge pump currents Ip and In, and improve the PLL jitter performance. Further, in accordance with certain implementations, the total number of iterations for OFR calibration can be limited to, e.g., N times. In such implementations, the PLL OFR calibration will stop once the maximum number of calibration has been reached. Here, then, the desired Vcnt range may be adjustable and may be set to a widest range at the last iteration of calibration.

Figure 11:
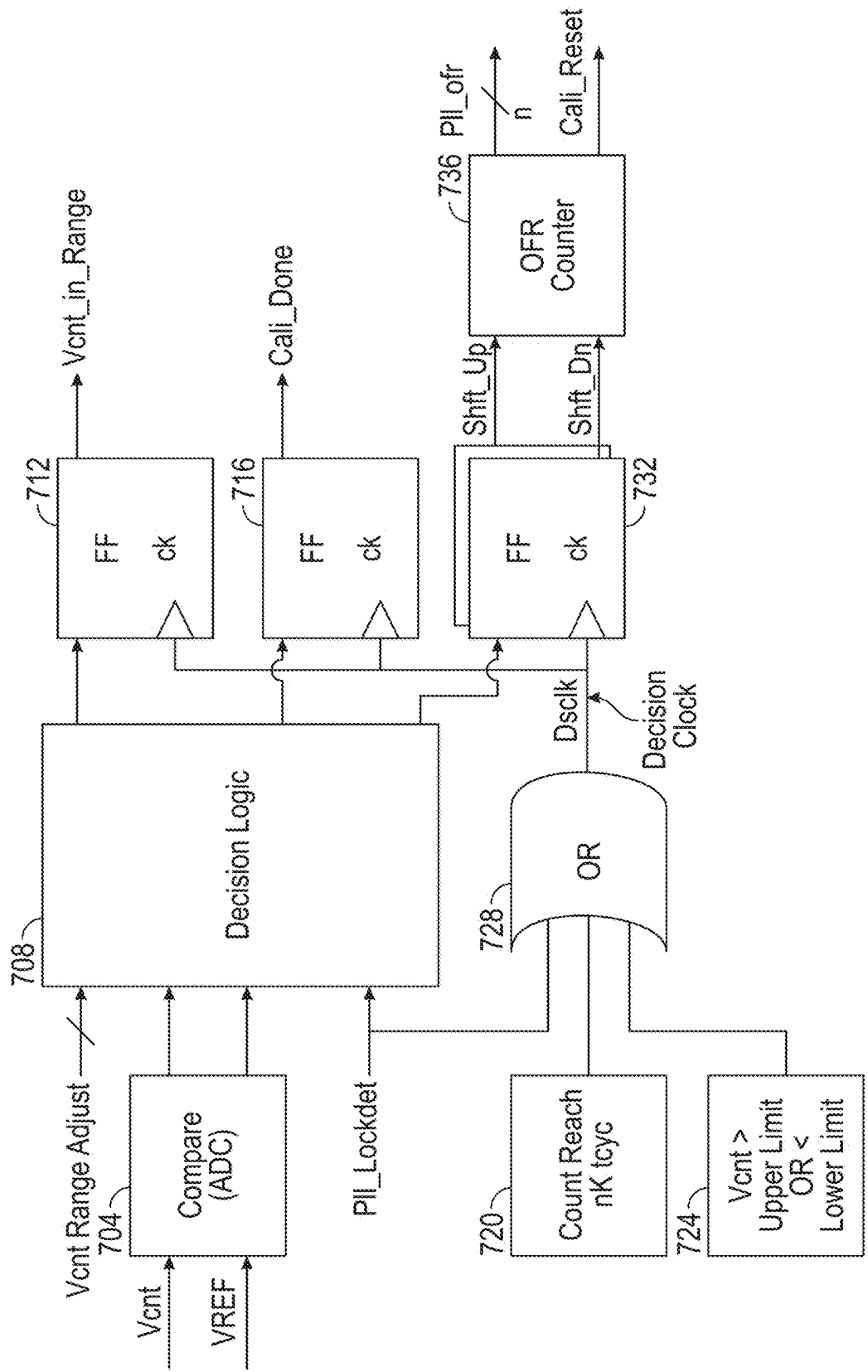
FIG. 11 is block diagram illustrating exemplary operating frequency range calibration circuitry of the present PLLs, consistent with certain aspects related to the innovations herein.

FIG. 11 is block diagram illustrating exemplary operating frequency range calibration circuitry of the present PLLs, consistent with certain aspects related to the innovations herein. In addition to compare circuitry 704, decision/shift circuitry 708 and OFR counter circuitry 736, which may be consonant with the circuitry 408, 416, 428 shown and described in connection with FIGS. 4-9, illustrative circuitry of FIG. 11 may include count circuitry 720 involved with reaching the specified wait period, limit circuitry 724 involved with determinations as to whether Vcnt is above or below the desired limits, as well as other logic 728 and/or flip-flops 712, 716, 732 involved with establishing or conveying associated signals such as the decision clock, Vcnt in range, calibration done, shift up, shift down, or other signaling.

Accordingly, via the circuitry and configurations above, optimal overall performance of a PLL with the closed-loop, continuous auto-calibration for the various levels of operating frequency range may be achieved consistent with one or more aspects of the present innovations.

In addition to the above innovations and architecture, the present inventions also include, inter alia, methods of operation, methods of fabricating devices consistent with the features and/or functionality herein, products, and products produced via such processes. By way of example and not limitation, methods of fabrication herein may include known manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

As disclosed herein, features consistent with the present inventions may be utilized via and/or involved with various circuits/circuitry, hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A method of controlling a voltage controlled oscillator (VCO), comprising:
   determining whether an input voltage to the VCO is within a desired range;
   generating a shift signal that shifts a current operating frequency range of the VCO to a different operating frequency range of the VCO when the input voltage is not within the desired range;
   shifting a counter up or down in response to the shift signal;
   generating a control signal corresponding to the shifted counter; and
   changing the operating frequency range of the VCO by changing a bias current of the VCO based on the shift signal to change the operating frequency range of the VCO to the different operating frequency range of the VCO.

2. The method of claim 1, further comprising generating an indication that the input voltage is not within the desired range when the input voltage is not within the desired range.

3. The method of claim 2, wherein the indication indicates whether the input voltage is above or below the desired range.

4. The method of claim 1, further comprising generating a shift instruction when the input voltage is not within the desired range.

5. The method of claim 1, wherein:
   the determining whether the input voltage is within a desired range comprises determining whether the input voltage is above or below the desired range;
   the shift instruction comprises an instruction to shift up when the input voltage is above the desired range; and
   the shift instruction comprises an instruction to shift down when the input voltage is below the desired range.

6. The method of claim 1, wherein the determining whether the input voltage is within a desired range comprises determining whether the input voltage is above or below the desired range.

7. The method of claim 6, wherein changing the OFR of the VCO comprises:
   changing the OFR of the VCO from a current one of the plurality of OFRs to a higher one of the plurality of OFRs when the input voltage is above the desired range; and
   changing the OFR of the VCO from a current one of the plurality of OFRs to a lower one of the plurality of OFRs when the input voltage is below the desired range.

* * * * *